(12) United States Patent
Kim et al.

(10) Patent No.: US 11,315,650 B2
(45) Date of Patent: Apr. 26, 2022

(54) MEMORY SYSTEM, MEMORY CONTROLLER, AND METHOD OF OPERATING MEMORY SYSTEM

(71) Applicant: SK hynix Inc., Icheon-si (KR)

(72) Inventors: Ju Yong Kim, Icheon-si (KR); Young Gyun Kim, Icheon-si (KR); Ki Woong Lee, Icheon-si (KR)

(73) Assignee: SK HYNIX INC.

( * ) Notice: Subject to any disclaimer, the term of this patent is extended or adjusted under 35 U.S.C. 154(b) by 0 days.

(21) Appl. No.: 17/155,655

(22) Filed: Jan. 22, 2021

(65) Prior Publication Data

US 2021/0407607 A1 Dec. 30, 2021

(30) Foreign Application Priority Data

Jun. 29, 2020 (KR) ........................ 10-2020-0079073

(51) Int. Cl.
*G11C 11/34* (2006.01)
*G11C 16/34* (2006.01)
*G11C 16/30* (2006.01)
*G11C 16/26* (2006.01)
*G11C 16/10* (2006.01)

(52) U.S. Cl.
CPC .......... *G11C 16/3459* (2013.01); *G11C 16/10* (2013.01); *G11C 16/26* (2013.01); *G11C 16/30* (2013.01)

(58) Field of Classification Search
CPC ............ G11C 16/3454; G11C 16/3459; G11C 11/5628; G11C 16/0483; G11C 2211/5621
USPC ........................................ 365/185.22, 189.05
See application file for complete search history.

(56) References Cited

U.S. PATENT DOCUMENTS 10,153,051 B1* 12/2018 Chen .................. G11C 16/0483
10,276,243 B2* 4/2019 Shirakawa ......... G11C 16/0483

FOREIGN PATENT DOCUMENTS

KR 10-2007-0122208 A 12/2007
KR 10-2018-0081956 A 7/2018

* cited by examiner

*Primary Examiner* — Son T Dinh
(74) *Attorney, Agent, or Firm* — Perkins Coie LLP

(57) ABSTRACT

A memory system is provided to include a memory device and a memory controller configured to control the memory device. The memory device includes a first data latch storing information about a state of the memory cell and is configured to: execute a first verification operation and a second verification operation on the memory cell in response to receiving, from the memory controller, a suspend command to suspend a program operation being performed on the memory cell; store, in the first data latch, a temporary value obtained based on a result value of the first verification operation and a result value of the second verification operation; and execute, a resumption command to resume the program operation, a third verification operation, and restore the result value of the first verification operation and the result value of the second verification operation.

18 Claims, 14 Drawing Sheets

FIG. 7

Suspend

| state | ST_1 | ST_2 | ST_3 |
|---|---|---|---|
| result of first verification operation | 1 | 1 | 0 |
| result of second verification operation | 0 | 1 | 1 |

⇩ (DL_1) = (result of first verification operation) & (result of second verification operation)

| state | ST_1 | ST_2 | ST_3 |
|---|---|---|---|
| DL_1 | 0 | 1 | 0 |

FIG.8

Read(after suspend)

| state | ST_1 | ST_2 | ST_3 |
|---|---|---|---|
| DL_1 | 0 | 1 | 0 |
| DL_2 | Used for read operation | | |

Resume

| state (suspend) | ST_1 | ST_2 | | ST_3 |
|---|---|---|---|---|
| state (resume) | ST_1 | ST_2-1 | ST_2-2 | ST_3 |
| result of first verification operation | 1 | 1 | | 0 |
| result of second verification operation | 0 | 1 | | 1 |
| result of third verification operation | 0 | 0 | 1 | 1 |
| DL_1 | 0 | 0 | 1 | 1 |
| DL_2 | 0 | 1 | | 0 |

IF (DL_2 == 1)
DL_1 = 1

| state (suspend) | ST_1 | ST_2 | | ST_3 |
|---|---|---|---|---|
| state (resume) | ST_1 | ST_2-1 | ST_2-2 | ST_3 |
| DL_1 | 0 | 1 | 1 | 1 |

Resume

| state (suspend) | ST_1 | ST_2 | | ST_3 |
|---|---|---|---|---|
| state (resume) | ST_1 | ST_2-1 | ST_2-2 | ST_3 |
| DL_1 | 0 | 1 | | 1 |
| DL_2 | 0 | 1 | | 0 |

IF (DL_1 == 0 && DL_2 ==0)
　　DL_2 = 1

| state (suspend) | ST_1 | ST_2 | | ST_3 |
|---|---|---|---|---|
| state (resume) | ST_1 | ST_2-1 | ST_2-2 | ST_3 |
| DL_1 | 0 | 1 | | 1 |
| DL_2 | 1 | 1 | | 0 |

== result of second verification operation

== result of first verification operation

MEMORY SYSTEM, MEMORY CONTROLLER, AND METHOD OF OPERATING MEMORY SYSTEM

CROSS REFERENCE TO RELATED APPLICATION

This patent document claims the priority and benefits of Korean patent application number 10-2020-0079073 filed on Jun. 29, 2020, which is incorporated herein by reference in its entirety.

TECHNICAL FIELD

The technology and implementations disclosed in this patent document relate to a memory system, a memory controller, and a method of operating the memory system.

BACKGROUND

Storage devices refer to electronic components that are used to store data on a permanent or temporary basis. Each storage device may include one or more storage medium to store data and operate based on a request from a host. Examples of the host include a computer, a mobile terminal (for example, a smartphone or a tablet), or various other electronic devices. The storage device can be classified based on the type of storage medium. For example, a hard disk drive (HDD) uses a magnetic disk as the storage medium and a solid state drive (SSD), a universal flash storage device (UFS), or an embedded MMC (eMMC) device use, as the storage medium, semiconductor devices such as a volatile memory device and a nonvolatile memory device.

A memory system may further include a memory controller for controlling the memory device. The memory controller may receive commands from the host and may execute or control operations for reading, writing, or erasing data in a volatile memory or a nonvolatile memory included in the memory system based on the received comments. The memory controller may drive firmware for performing a logical operation for controlling such operations.

The memory system includes memory cells that are used as digital storage. By performing a program operation (or referred to as a write operation) to program or write data on a memory cell, the memory cell is programmed to one of multiple states. In some circumstances, however, a program operation being performed on a memory cell may be suspended. For example, the program operation is suspended and a read operation is executed while the program operation is suspended. The program operation which has been suspended can resume after receiving a resumption command. The operations of the memory system including the suspension of the program operation and the resumption of the program operation can increase a quality of service (QoS) for a host.

SUMMARY OF THE INVENTION

Embodiments of the disclosed technology may provide a memory system, a memory device, and a method of operating the memory device, which are capable of restoring a verification result after a resumption of a program operation such that the restored verification result is identical to a verification result that was obtained before a suspension of the program operation.

Some embodiments of the disclosed technology may provide a memory system, a memory device, and a method of operating the memory device, which are capable of preventing an abnormal execution of a program operation caused by a change in the threshold voltage distribution in the case of the suspension of the program operation.

In an aspect of the present disclosure, embodiments of the present disclosure may provide a memory system including a memory device including a memory cell array including a memory cell programmable in multiple states and a memory controller in communication with the memory device and configured to control the memory device.

The memory device may include a memory cell and a first data latch storing information about a state of the memory cell.

The memory device may execute a first verification operation and a second verification operation on the memory cell in response to receiving, from the memory controller, a suspend command to suspend a program operation being performed on the memory cell. The first verification operation and the second verification operation may be performed using verification voltages to determine a state of the memory cell.

The memory device may store, in the first data latch, a temporary value obtained based on a result value of the first verification operation and the result value of the second verification operation.

The memory device may execute, in response to receiving, from the memory controller, a resumption command to resume the program operation, a third verification operation, and may restore the result value of the first verification operation and the result value of the second verification operation on the basis of the result value of the third verification operation and the temporary value stored in the first data latch.

In this instance, the verification voltage used for the first verification operation is higher than the verification voltage used for the second verification operation and the third verification operation. The verification voltage used for the second verification operation and the verification voltage used for the third verification operation may be identical.

The memory device may set the temporary value to a first value when both of the result value of the first verification operation and the result value of the second verification operation are the first value, and may set the temporary value to a second value when the result value of the first verification operation or the result value of the second verification operation is the second value.

The memory device may further include a second data latch configured to be used during a read operation that is executed between the receiving of the suspension command and the receiving of the resumption command.

The memory device may store, in response to the receiving of the resumption command, the temporary value that has been stored in the first data latch in a second data latch, and may store the result value of the third verification operation in the first data latch.

The memory device may set the first data latch to the first value when the temporary value stored in the second data latch is the first value, and may set the second data latch to the first value when both of the temporary value stored in the second data latch and the result value of the third verification operation stored in the first data latch are the second value.

In another aspect of the present disclosure, embodiments of the present disclosure may provide a memory device that communicates with a memory controller.

The memory device may include a memory cell programmable in multiple states and a first data latch storing information about a state of the memory cell.

The memory device may execute a first verification operation and a second verification operation on the memory cell in response to receiving, from the memory controller, a suspend command to suspend a program operation being performed on the memory cell. The first verification operation and the second verification operation may be performed different verification voltages to verify a state of the memory cell.

The memory device may store, in the first data latch, a temporary value obtained based on a result value of the first verification operation and the result value of the second verification operation.

The memory device may execute a third verification operation in response to receiving, from the memory controller, a resumption command to resume the program operation, and may restore the result value of the first verification operation and the result value of the second verification operation based on the result value of the third verification operation and the temporary value stored in the first data latch.

In another aspect of the present disclosure, embodiments of the present disclosure may provide a method of operating a memory device.

The method of operating the memory device may include receiving, from the memory controller, a suspend command to suspend a program operation being performed on a memory cell in the memory device and programmable in multiple states.

The method of operating the memory device may include an operation of executing a first verification operation and a second verification operation on the memory cell using verification voltages to determine a state of the memory cell.

The method of operating the memory device may include an operation of storing, in a first data latch, a temporary value obtained based on a result value of the first verification operation and the result value of the second verification operation.

The method of operating the memory device may include an operation of receiving, from the memory controller, a resumption command to resume the program operation.

The method of operating the memory device may include an operation of executing a third verification operation and restoring the result value of the first verification operation and the result value of the second verification operation on the basis of the result value of the third verification operation and the temporary value stored in a second data latch, when a resume command associated with a suspended program operation is received.

In this instance, a verification voltage used for the first verification operation may be higher than a verification voltage used for the second verification operation and the third verification operation. The verification voltage used for the second verification operation and the verification voltage used for the third verification operation may be identical.

The temporary value is a first value when both of the result value of the first verification operation and the result value of the second verification operation are the first value, and the temporary value is a second value when the result value of the first verification operation or the result value of the second verification operation is the second value.

The restoring of the result value of the first verification operation and the result value of the second verification operation may include storing the temporary value that has been stored in the first data latch in a second data latch, and storing the result value of the third verification operation in the first data latch.

The restoring of the result value of the first verification operation and the result value of the second verification operation may include setting the first data latch to the first value when the temporary value stored in the second data latch is the first value, and setting the second data latch to the first value when both of the temporary value stored in the second data latch and the result value of the third verification operation stored in the first data latch are the second value.

According to some embodiments of the disclosed technology, when resuming a program operation which was suspended, a verification result can be restored to be identical to a verification result obtained before the program operation was suspended.

According to some embodiments of the disclosed technology, an abnormal execution of a program operation, which may be caused by changes in a threshold voltage distribution when a program operation is suspended, can be prevented.

BRIEF DESCRIPTION OF THE DRAWINGS

The above and other aspects, features and advantages of the disclosed technology will be more apparent from the following detailed description taken in conjunction with the accompanying drawings, in which:

FIG. 7 is a diagram illustrating a value stored in a first data latch when a program operation is suspended.

FIG. 8 is a diagram illustrating states of first and second data latches when a read operation is executed after a program operation is suspended.

DETAILED DESCRIPTION

Hereinafter, embodiments of the disclosed technology will be described in detail with reference to the accompanying drawings.

When receiving the resumption command, the memory system performs a verification operation to verify a state of the memory cell. In the process of resuming the suspended program operation, the verification point for the data written in a memory cell may be changed, or a portion of the verification data that was obtained before the write operation was suspended may be lost. Thus, the verification to determine the state of the memory cell may be abnormally performed in the process of writing data in the memory device, and the threshold value distribution of memory cells in which the data is written may deteriorate, which is a drawback. In recognition of this, the disclosed technology provides various implementations that enable to obtain a result of the verification operation without being affected due to undesired situations in the process of resuming operation.

Figure 1:
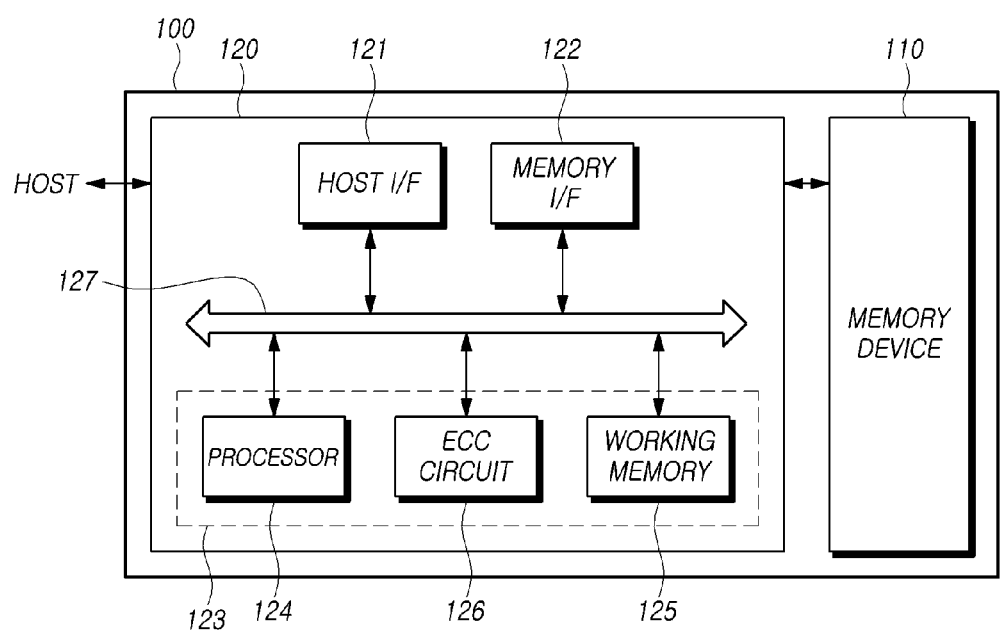
FIG. 1 is a schematic diagram illustrating a configuration of a memory system based on some implementations of the disclosed technology.

FIG. 1 is a diagram illustrating the schematic configuration of a memory system 100 according to an embodiment of the disclosed technology.

Referring to FIG. 1, the memory system 100 may include a memory device 110 configured to store data, and a memory controller 120 configured to control the memory device 110.

The memory device 110 may include multiple memory blocks. The memory device 110 may be configured to operate in response to control signals received from the memory controller 120. Operations of the memory device 110 may include, for example, a read operation, a program operation (also referred to as a "write operation"), an erasure operation, and the like.

The memory device 110 may include a memory cell array including multiple memory cells (also simply referred to as "cells") configured to store data. In some implementations, each of the memory cells can be structured or operated to store a single bit or more bits of information. The memory cell array may be organized in different blocks and pages for memory operations. The cells of the memory cell array may be organized to include a plurality of memory blocks. Each memory block may include a plurality of pages, and each page corresponds to a plurality of memory cells.

For example, the memory device 110 may be implemented as various types, such as a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), or a spin transfer torque random access memory (STT-RAM).

The memory device 110 may be implemented in a three-dimensional array structure. In some implementations, embodiments of the disclosed technology are applicable to a flash memory device having an electric charge storage layer configured as a conductive floating gate. In some other implementations, the embodiments of the disclosed technology are applied to a flash memory device having a charge trap flash (CTF) having an electric charge storage layer configured as an insulating film.

The memory controller 120 can access the memory device 110 based on requests from the user/host by providing command/address signals to the memory controller 120. In some implementations, the memory device 110 may be configured to receive, from the memory controller, a command and an address in which the command is performed or executed, and access an area of the memory cell array selected using the address. For example, the memory device 110 may perform an operation corresponding to the received command in a memory area of the memory device having a physical address corresponding to the received address from the memory controller 120.

For example, the memory device 110 may perform a program operation, a read operation, an erasure operation, or others. During the program operation, the memory device 110 may program data in the area selected by the address. During the read operation, the memory device 110 may read data from the area selected by the address. During the erasure operation, the memory device 110 may erase data stored in the area selected by the address.

The memory controller 120 may control write (program), read, erasure, or background operations with regard to the memory device 110. The background operation may include, for example, at least one among a garbage collection operation (GC), a wear leveling (WL) operation, and a bad block management (BBM) operation. The term "garbage collection" as used herein may refer to a form of memory management, in which a garbage collector attempts to reclaim (garbage) memory that is occupied by objects that are no longer in use. The wear leveling indicates techniques for prolonging lifetime of erasable storage devices.

The memory controller 120 may control the operation of the memory device 110 at the request of a host. Alternatively, the memory controller 120 may control the operation of the memory device 110 without a corresponding request of the host, such as, for example, when it performs one or more background operations of the memory device.

The memory controller 120 and the host may be separate devices. In some cases, the memory controller 120 and the host may be integrated and implemented as a single device. In the following description, the memory controller 120 and the host are separate devices.

Referring to FIG. 1, the memory controller 120 may include a memory interface 122, a control circuit 123, and a host interface 121.

The host interface 121 may be configured to provide an interface for communication with the host.

When receiving a command from the host HOST, the control circuit 123 may receive the command through the host interface 121 and may perform an operation of processing the received command.

The memory interface 122 may be connected to the memory device 110 to provide an interface for communication with the memory device 110. That is, the memory interface 122 may be configured to provide the memory device 110 and the memory controller 120 with an interface in response to a control of the control circuit 123.

The control circuit 123 may be configured to control the operation of the memory device 110 by performing operations for an overall control of the memory controller 120. For example, the control circuit 123 may include a processor 124 and a working memory 125. The control circuit 123 may further include an error detection/correction circuit (ECC circuit) 126 and the like.

The processor 124 may control the overall operation of the memory controller 120. The processor 124 may perform a logical operation. The processor 124 may communicate with the host HOST through the host interface 121. The processor 124 may communicate with the memory device 110 through the memory interface 122.

The processor 124 may perform a function of a flash translation layer (FTL). The processor 124 may translate a logical block address (LBA) provided by the host into a physical block address (PBA) through the FTL. The FTL may receive the LBA and translate the LBA into the PBA by using a mapping table.

There are various address mapping methods which may be employed by the FTL, according to the mapping unit. Typical address mapping methods may include a page mapping method, a block mapping method, and a hybrid mapping method.

The processor 124 may be configured to randomize data received from the host. For example, the processor 124 may randomize data received from the host by using a randomizing seed. The randomized data is provided to the memory device 110 as data to be stored, and is programmed in the memory cell array.

The processor 124 may be configured to derandomize data received from the memory device 110 during a read operation. For example, the processor 124 may derandomize data received from the memory device 110 by using a derandomizing seed. The derandomized data may be output to the host HOST.

The processor 124 may execute firmware (FW) to control the operation of the memory controller 120. In other words, the processor 124 may control the overall operation of the memory controller 120 and, in order to perform a logical operation, may execute (drive) firmware loaded into the working memory 125 during booting.

The firmware refers to a program executed inside the memory system 100, and may include various functional layers.

For example, the firmware may include at least one of a flash translation layer (FTL) configured to translate between a logical address that the host HOST requests the memory system 100 to provide and a physical address of the memory device 110, a host interface layer (HIL) configured to interpret a command that the host HOST issues to the memory system 100 (storage device) and to deliver the same to the FTL, and a flash interface layer (FIL) configured to deliver a command issued by the FTL to the memory device 110.

For example, the firmware may be stored in the memory device 110, then loaded into the working memory 125.

The working memory 125 may store firmware, program codes, commands, or pieces of data necessary to drive the memory controller 120. The working memory 125 may include, for example, at least one among a static RAM (SRAM), a dynamic RAM (DRAM), and a synchronous RAM (SDRAM) as a volatile memory.

The error detection/correction circuit 126 may be configured to detect an error bit of check target data by using an error correction code, and to correct the detected error bit. For example, the check target data may be data stored in the working memory 125, data retrieved from the memory device 110, or the like.

The error detection/correction circuit 126 may be implemented to decode data by using the error correction code. The error detection/correction circuit 126 may be implemented by using various code decoders. For example, a decoder that performs nonsystematic code decoding or a decoder that performs systematic code decoding may be used.

For example, the error detection/correction circuit 126 may detect an error bit, sector by sector, with regard to each piece of read data. Each piece of read data may include multiple sectors. As used herein, a sector may refer to a data unit smaller than the read unit (page) of a flash memory. Sectors constituting each piece of read data may correspond to each other via an address.

The error detection/correction circuit 126 may calculate a bit error rate (BER) and determine whether or not correction can be made sector by sector. For example, if the BER is higher than a reference value, the error detection/correction circuit 126 may determine that the corresponding sector is uncorrectable or "a fail". If the BER is lower than or equals to the reference value, the error detection/correction circuit 126 may determine that the corresponding sector is correctable or "a pass".

The error detection/correction circuit 126 may perform error detection and correction operations successively with regard to all pieces of read data. When a sector included in the read data is correctable, the error detection/correction circuit 126 may omit the error detection and correction operations related to the corresponding sector with regard to the next piece of read data. After finishing error detection and correction operations with regard to all pieces of read data in this manner, the error detection/correction circuit 126 may detect a sector deemed uncorrectable to the end. There may be one or more sectors deemed uncorrectable. The error detection/correction circuit 126 may deliver information (for example, address information) regarding the sectors deemed uncorrectable to the processor 124.

The bus 127 may be configured to provide a channel between the constituent elements 121, 122, 124, 125, and 126 of the memory controller 120. The bus 127 may include, for example, a control bus for delivering various types of control signals and commands, and a data bus for delivering various types of data.

The above-mentioned constituent elements 121, 122, 124, 125, and 126 of the memory controller 120 are only provided as examples. It is noted that some of the above-mentioned constituent elements 121, 122, 124, 125, and 126 of the memory controller 120 may be omitted, or some of the above-mentioned constituent elements 121, 122, 124, 125, and 126 of the memory controller 120 may be integrated into a single element. In addition, in some cases, one or more other constituent elements may be added, in addition to the above-mentioned constituent elements of the memory controller 120.

Hereinafter, the memory device 110 will be described in more detail with reference to FIG. 2.

Figure 2:
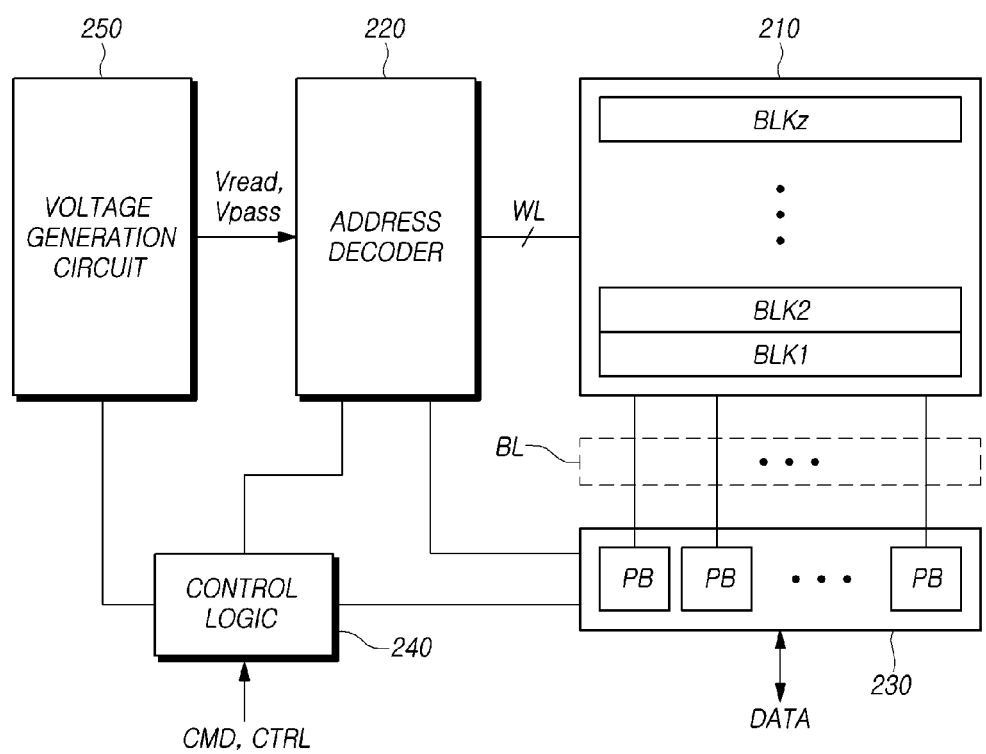
FIG. 2 is a block diagram schematically illustrating a memory device based on some implementations of the disclosed technology.

FIG. 2 is a block diagram schematically illustrating a memory device 110 according to an embodiment of the disclosed technology.

Referring to FIG. 2, the memory device 110 may include a memory cell array 210, an address decoder 220, a read/write circuit 230, a control logic 240, and a voltage generation circuit 250.

The memory cell array 210 may include multiple memory blocks BLK1-BLKz, where z is a natural number equal to or larger than 2.

In the multiple memory blocks BLK1-BLKz, multiple word lines WL and multiple bit lines BL may be disposed in rows and columns, and multiple memory cells MC may be arranged.

The multiple memory blocks BLK1-BLKz may be connected to the address decoder 220 through the multiple word lines WL. The multiple memory blocks BLK1-BLKz may be connected to the read/write circuit 230 through the multiple bit lines BL.

Each of the multiple memory blocks BLK1-BLKz may include multiple memory cells. For example, the multiple memory cells are nonvolatile memory cells. In some implementations, such nonvolatile memory cells have a vertical channel structure.

The memory cell array 210 may include a memory cell array having a two-dimensional structure or a memory cell array having a three-dimensional structure.

Each of the multiple memory cells included in the memory cell array 210 may store at least one bit of data. For example, each of the multiple memory cells included in the memory cell array 210 may be a single-level cell (SLC) configured to store one bit of data per memory cell. In another example, each of the multiple memory cells included in the memory cell array 210 may be a multi-level cell (MLC) configured to store two bits of data per memory cell. In another example, each of the multiple memory cells included in the memory cell array 210 may be a triple-level cell (TLC) configured to store three bits of data per memory cell. In another example, each of the multiple memory cells included in the memory cell array 210 may be a quad-level cell (QLC) configured to store four bits of data per memory cell. In another example, the memory cell array 210 may include multiple memory cells, each of which may be configured to store at least five bits of data per memory cell.

Referring to FIG. 2, the address decoder 220, the read/write circuit 230, the control logic 240, and the voltage generation circuit 250 may operate as peripheral circuits configured to drive the memory cell array 210.

The address decoder 220 may be connected to the memory cell array 210 through the multiple word lines WL.

The address decoder 220 may be configured to operate in response to a command and control signals of the control logic 240.

The address decoder 220 may receive addresses through an input/output buffer inside the memory device 110. The address decoder 220 may be configured to decode a block address among the received addresses. The address decoder 220 may select at least one memory block based on the decoded block address.

The address decoder 220 may receive a read voltage Vread and a pass voltage Vpass from the voltage generation circuit 250.

The address decoder 220 may apply the read voltage Vread to a selected word line WL inside a selected memory block, when applying the read voltage during a read operation, and may apply the pass voltage Vpass to the remaining non-selected word lines WL.

The address decoder 220 may apply a verification voltage generated by the voltage generation circuit 250 to a selected word line WL inside a selected memory block, during a program verification operation, and may apply the pass voltage Vpass to the remaining non-selected word lines WL.

The address decoder 220 may be configured to decode a column address among the received addresses. The address decoder 220 may transmit the decoded column address to the read/write circuit 230.

The memory device 110 may perform the read operation and the program operation based on a page basis. In some implementations, the memory cell array may include memory blocks and each memory block may include a plurality of pages, each page corresponding to a plurality of memory cells. Addresses received when the read operation and the program operation are requested may include at least one of a block address, a row address, and a column address.

The address decoder 220 may select one memory block and one word line based on the block address and the row address. The column address may be decoded by the address decoder 220 and provided to the read/write circuit 230.

The address decoder 220 may include at least one of a block decoder, a row decoder, a column decoder, and an address buffer.

The read/write circuit 230 may include multiple page buffers PB. The read/write circuit 230 may operate as a "read circuit" when the memory cell array 210 performs a read operation, and may operate as a "write circuit" when the memory cell array 210 performs a write operation.

The above-mentioned read/write circuit 230 is also referred to as a page buffer circuit including multiple page buffers PB, or a data register circuit. The read/write circuit 230 may include a data buffer that can hold data for data processing and, in some implementations, may further include a cache buffer for data caching.

The multiple page buffers PB may be connected to the memory cell array 210 through the multiple bit lines BL. In order to detect or sense the threshold voltage Vth of the memory cells during a read operation and a program verification operation, the multiple page buffers PB may continuously supply a sensing current to the bit lines BL connected to the memory cells to detect, at a sensing node, an electric a change proportional to the current based on the program state of a corresponding memory cell, and may latch the corresponding voltage as sensing data.

The read/write circuit 230 may operate in response to page buffer control signals output from the control logic 240.

During a read operation, the read/write circuit 230 senses a voltage value of a memory cell and the voltage value is read out as data. The read/write circuit 230 temporarily stores the retrieved data, and outputs the data DATA to the input/output buffer of the memory device 110. In an embodiment, the read/write circuit 230 may include a column selection circuit, in addition to the page buffers PB or page registers.

The control logic 240 may be connected to the address decoder 220, the read/write circuit 230, and the voltage generation circuit 250. The control logic 240 may receive a command CMD and a control signal CTRL through the input/output buffer of the memory device 110.

The control logic 240 may be configured to control the overall operation of the memory device 110 in response to the control signal CTRL. The control logic 240 may output a control signal for adjusting the voltage level of sensing nodes of multiple page buffers PB to a pre-charge voltage level.

The control logic 240 may control the read/write circuit 230 to perform a read operation in the memory cell array 210. The voltage generation circuit 250 may generate a read voltage Vread and a pass voltage Vpass, which are used during the read operation, in response to a voltage generation circuit control signal output from the control logic 240.

A memory block BLK included in the memory device 110 may include multiple pages PG and multiple strings. The multiple pages PG correspond to multiple word lines WL, and the multiple strings STR correspond to multiple bit lines BL.

In the memory block BLK, multiple word lines WL and multiple bit lines BL may be arranged to intersect. For example, each of the multiple word lines WL may be arranged in the row direction, and each of the multiple bit lines BL may be arranged in the column direction. In another example, each of the multiple word lines WL may be arranged in the column direction, and each of the multiple bit lines BL may be arranged in the row direction.

The multiple word lines WL and the multiple bit lines BL may intersect with each other, thereby defining multiple memory cells MC. Each memory cell MC may have a transistor TR arranged therein.

For example, the transistor TR arranged in each memory cell MC may include a drain, a source, and a gate. The drain (or source) of the transistor TR may be connected to the corresponding bit line BL directly or via another transistor TR. The source (or drain) of the transistor TR may be connected to the source line (which may be the ground) directly or via another transistor TR. The gate of the transistor TR may include a floating gate (FG) surrounded by an insulator, and a control gate (CG) to which a gate voltage is applied from a word line WL.

In each of the multiple memory blocks BLK1-BLKz, a first selection line (also referred to as a source selection line or a drain selection line) may be additionally arranged outside the first outermost word line, which is closer to the read/write circuit 230 among two outermost word lines, and a second selection line (also referred to as a drain selection line or a source selection line) may be additionally arranged outside the other second outermost word line.

In some cases, at least one dummy word line may be additionally arranged between the first outermost word line and the first selection line. In addition, at least one dummy word line may be additionally arranged between the second outermost word line and the second selection line.

A read operation and a program operation (write operation) of the memory block may be performed on a page basis, and an erasure operation may be performed memory block on a memory block basis.

Figure 3:
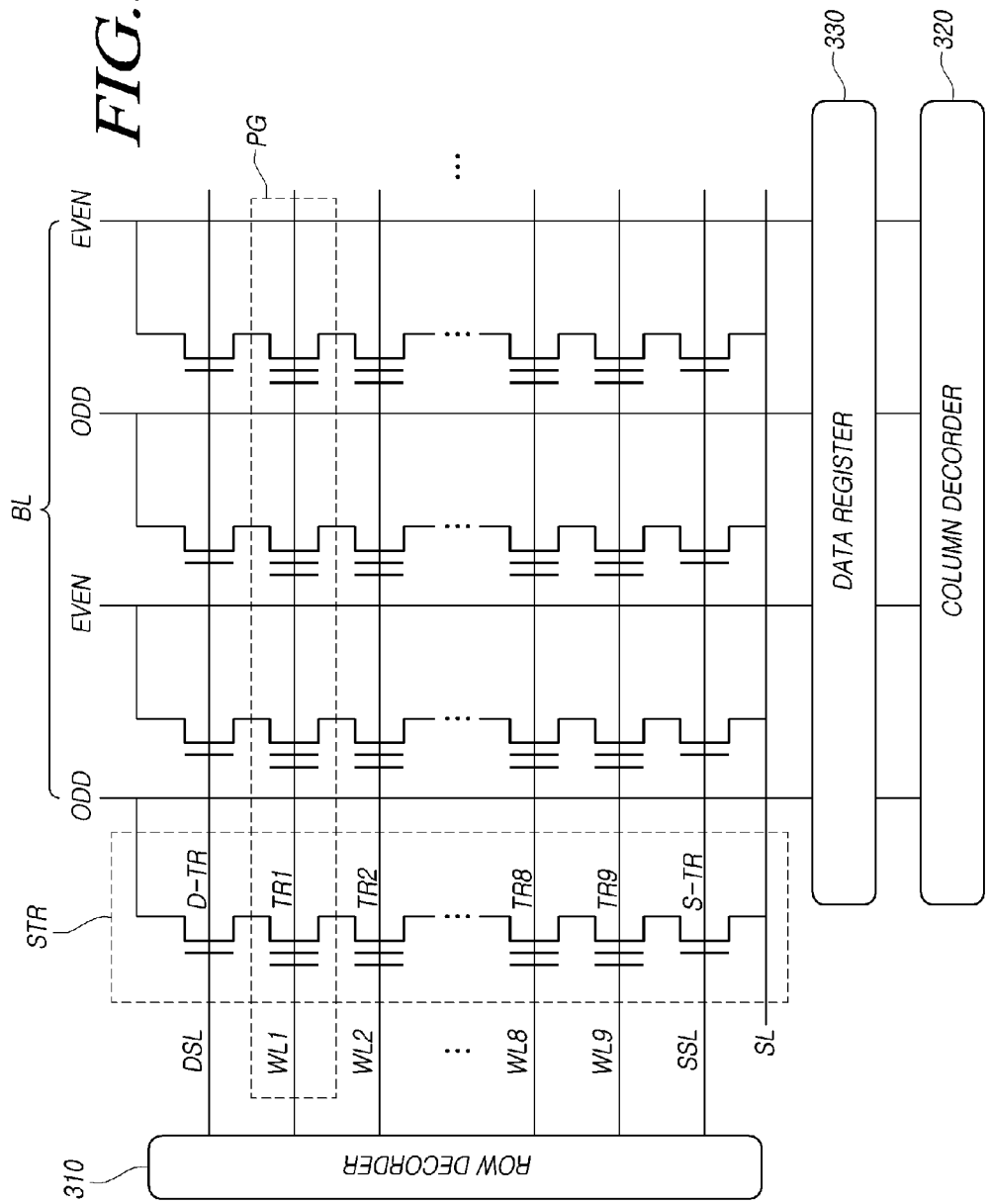
FIG. 3 is a diagram illustrating a structure of word lines and bit lines of a memory device based on some implementations of the disclosed technology.

FIG. 3 is a diagram illustrating a structure of word lines WL and bit lines BL of a memory device 110 according to an embodiment of the disclosed technology.

Referring to FIG. 3, the memory device 110 has a core area in which memory cells MC are concentrated, and an auxiliary area which corresponds to the remaining area other than the core area. The auxiliary area includes circuitry for supporting the operations of the memory cell array 210.

The core area may include pages PG and strings STR. In some implementations, multiple word lines WL1-WL9 and multiple bit lines BL are arranged to intersect.

The word lines WL1-WL9 may be connected to a row decoder 310. The bit lines BL may be connected to a column decoder 320. A data register 330, which corresponds to the read/write circuit 230 of FIG. 2, may exist between the multiple bit lines BL and the column decoder 320.

The multiple word lines WL1-WL9 may correspond to multiple pages PG.

For example, each of the multiple word lines WL1-WL9 may correspond to one page PG as illustrated in FIG. 3. When each of the multiple word lines WL1-WL9 has a large size, each of the multiple word lines WL1-WL9 may correspond to at least two (for example, two or four) pages PG. Each page PG is the smallest unit in connection with conducting a program operation and a read operation, and all memory cells MC within the same page PG may perform simultaneous operations when conducting a program operation and a read operation.

The multiple bit lines BL may be connected to the column decoder 320. In some implementations, the multiple bit lines BL may be divided into odd-numbered bit lines BL and even-numbered bit lines BL such that a pair of odd-numbered bit line BL and even-numbered bit line B are coupled in common to a column decoder 320.

The address may be used to access one or more memory cells MC in the core area. The address can be provided through the input/output end to the row decoder 310 and the column decoder 320 to select a corresponding target memory cell. In some implementations, a target memory cell may refer to one of the memory cells MC that is targeted to be accessed from the memory controller or the user, and in some implementations, the memory cell MC may be located at intersections between the word lines WL1-WL9 connected to the row decoder 310 and the bit lines BL connected to the column decoder 320.

In some implementations, the data register 330 plays a role because all data processing by the memory device 110, including program and read operations, occurs via the data register 330. If data processing by the data register 330 is delayed, all of the other areas need to wait until the data register 330 finishes the data processing, which degrades the overall performance of the memory device 110.

Referring to the example illustrated in FIG. 3, in one string STR, multiple transistors TR1-TR9 may be connected to multiple word lines WL1-WL9, respectively. In some implementations, the multiple transistors TR1-TR9 correspond to memory cells MC. In this example, the multiple transistors TR1-TR9 include control gates CG and floating gates FG.

The multiple word lines WL1-WL9 include two outermost word lines WL1 and WL9. A first selection line DSL may be additionally arranged outside the first outermost word line WL1, which is closer to the data register 330 and has a shorter signal path compared to the other outermost word line WL9. A second selection line SSL may be additionally arranged outside the other second outermost word line WL9.

The first selection transistor D-TR, which is controlled to turn on/off by the first selection line DSL, has a gate electrode connected to the first selection line DSL, but includes no floating gate FG. The second selection transistor S-TR, which is controlled to turn on/off by the second selection line SSL, has a gate electrode connected to the second selection line SSL, but includes no floating gate FG.

The first selection transistor D-TR is used as a switch circuit that connects the corresponding string STR to the data register 330. The second selection transistor S-TR is used as a switch circuit that connects the corresponding string STR to the source line SL. Thus, the first selection transistor D-TR and the second selection transistor S-TR can be used to enable or disable the corresponding string STR and deliver/block signals.

During a program operation, the memory system 100 fills the target memory cell MC of the bit line BL which is to be programmed with electrons. Accordingly, the memory system 100 applies a predetermined turn-on voltage Vcc to the gate electrode of the first selection transistor D-TR, thereby turning on the first selection transistor D-TR, and applies a predetermined turn-off voltage (for example, 0V) to the gate electrode of the second selection transistor S-TR, thereby turning off the second selection transistor S-TR.

The memory system 100 turns on both of the first and second selection transistors D-TR and S-TR during a read operation or a verification operation. Accordingly, during a read operation or a verification operation, an electric current may flow through the corresponding string STR and drain to the source line SL, which corresponds to the ground voltage, such that the voltage level of the bit line BL can be measured. However, during a read operation, there may be a time difference in the on/off timing between the first selection transistor D-TR and the second selection transistor S-TR.

The memory system 100 may apply a predetermined voltage (for example, +20V) to the substrate through a source line SL during an erasure operation. The memory system 100 applies a certain voltage to allow both the first selection transistor D-TR and the second selection transistor S-TR to float during an erasure operation. As a result, the applied erasure voltage can remove electrical charges from the floating gate FG of the selected memory cell.

Figure 4:
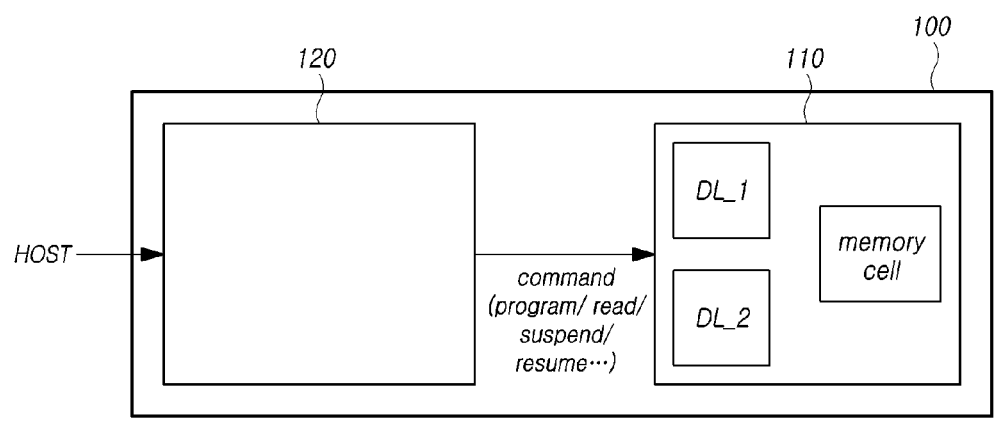
FIG. 4 is a schematic diagram illustrating a memory system based on some implementations of the disclosed technology.

FIG. 4 is a schematic diagram illustrating the memory system 100 according to various embodiments of the disclosed technology.

Referring to FIG. 4, a memory controller 120 of the memory system 100 may transmit a command to perform an operation (e.g., a program operation, a read operation, or a delete operation) on the memory device 110 in order to process a request from a host (HOST). The memory device 110 may execute an operation based on a command received from the memory controller 120.

The memory device 110 may include a first data latch (DL_1). The memory device 110 may additionally include a second data latch (DL_2). The first data latch (DL_1) and the second data latch (DL_2) may be or include circuits each of which is capable of storing 1 bit of data, and is used for storing the program state information of a memory cell on which programming is performed during a program operation. Each of the first data latch (DL_1) and the second data latch (DL_2) may be implemented as, for example, a flip-flop circuit, a register, or others.

While the memory device 110 performs a program operation in response to a program command received from the memory controller 120, the memory controller 120 may transmit, to the memory device 110, a suspend command that orders suspension of the program operation currently being performed. When the memory controller 120 receives a separate suspend command from a host (HOST), or receives a read request from the host while the program operation is being performed, the memory controller 120 may transmit a suspend command to the memory device 110.

The memory device 110 may suspend the program operation currently being performed after receiving the suspend command from the memory controller 120, and subsequently, may execute another command (e.g., a read command) received from the memory controller 120. The memory device 110 may receive, from the memory controller, a resume command that instructs the memory device to resume the program operation that was suspended and may resume the suspended program operation.

Hereinafter, the operation of the memory controller 120 and the memory device 110 when a program operation is suspended and resumed will be described with reference to FIG. 5.

Figure 5:
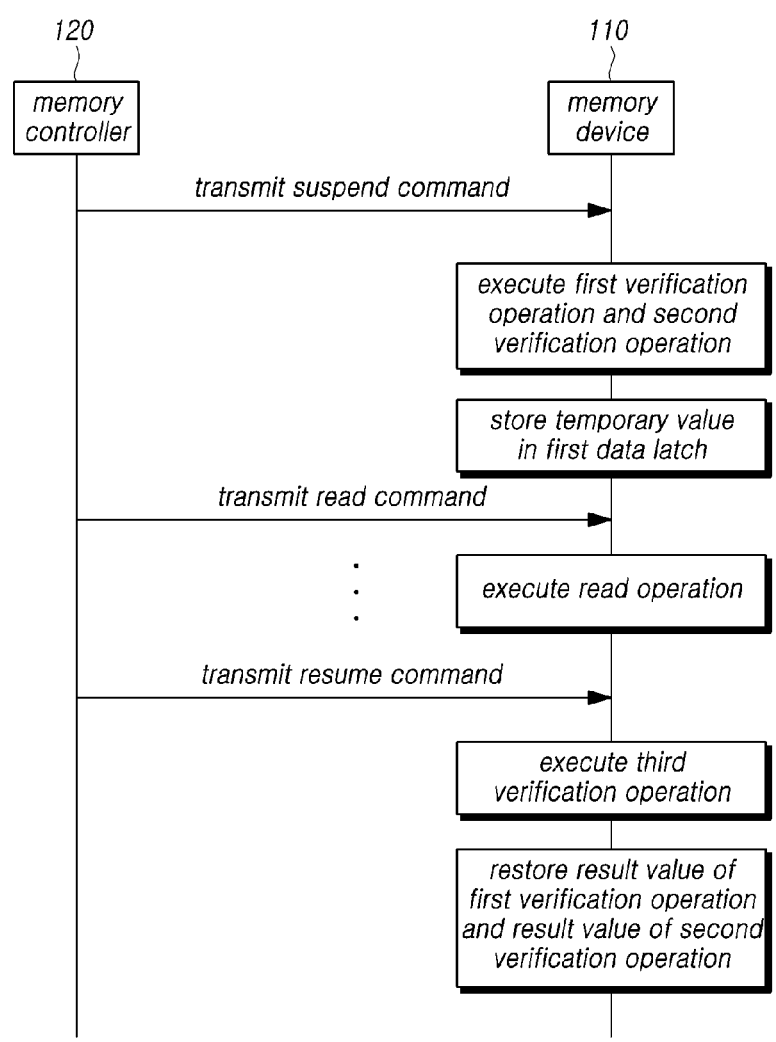
FIG. 5 is a flowchart illustrating the operation of a memory controller and a memory device based on some implementations of the disclosed technology.

FIG. 5 is a flowchart illustrating the operation of the memory controller 120 and the memory device 110 according to embodiments of the disclosed technology.

Referring to FIG. 5, the memory controller 120 may transmit, to the memory device 110, a suspend command that orders suspension of a program operation currently being performed.

When the memory device 110 receives the suspend command while the program operation is being performed on a memory cell, the memory device 110 may perform a first verification operation and a second verification operation on the corresponding memory cell.

Each of the first verification operation and the second verification operation may be an operation of applying a verification voltage to a memory cell so as to verify the program state of the corresponding memory cell. In some implementations, the verification voltage can be preset. In this instance, the value of the verification voltage used for the first verification operation may be higher than the value of the verification voltage used for the second verification operation.

Subsequently, the memory device 110 may store a temporary value that is produced or obtained on the basis of the result value of the first verification operation and the result value of the second verification operation, in a first data latch (DL_1) included in the memory device 110. Subsequently, the memory device 110 may enter the state in which the program operation is suspended.

Subsequently, the memory controller 120 may transmit a read command to the memory device 110 in order to process a read operation requested from a host (HOST) in the state in which the program operation is suspended. After receiving the read command, the memory device 110 may perform the read operation indicated by the corresponding read command.

Subsequently, the memory controller 120 may transmit a resume command to the memory device 110 in order to resume the suspended program operation.

After receiving the resume command, the memory device 110 may perform a third verification operation on the memory cell on which the program operation was suspended. In the third verification operation, the memory device 110 may verify the program state of the corresponding memory cell using a verification voltage that is the same as a verification voltage used for the second verification operation.

Based on the result value of the third verification operation and the temporary value stored in the first data latch (DL_1), the memory device 110 may restore the result value of the first verification operation and the result value of the second verification operation, which are obtained before the program operation was suspended.

Hereinafter, embodiments of the above-described operation of the memory device 110 will be described in detail with reference to drawings.

Figure 6:
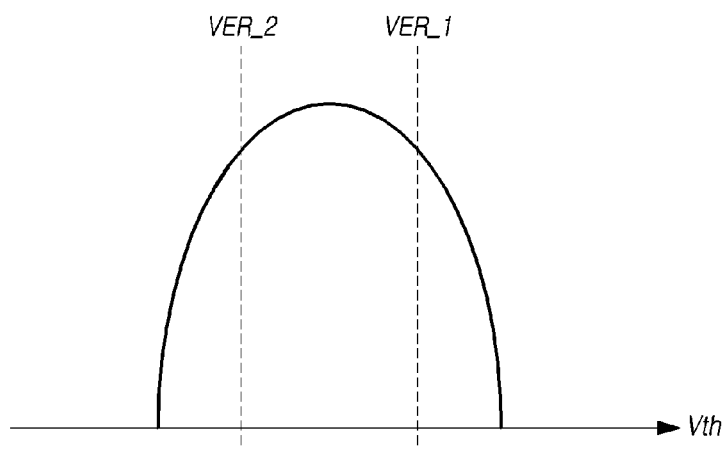
FIG. 6 is a diagram illustrating results of first and second verification operations when a program operation is performed.

FIG. 6 is a diagram illustrating the result of a first verification operation and the result of a second verification operation when a program operation is performed.

As illustrated in FIG. 5, the memory device 110 may perform the first verification operation and the second verification operation on a memory cell in order to verify the program state of the memory cell.

In the first verification operation, the memory device 110 may apply a first verification voltage (VER_1) to a memory cell. In the second verification operation, the memory device 110 may apply a second verification voltage (VER_2) to the memory cell. In this instance, as illustrated in FIG. 5, the first verification voltage (VER_1) applied to the memory cell when the first verification operation is performed is higher than the second verification voltage (VER_2) applied to the memory cell when the second verification operation is performed.

In this instance, based on the threshold voltage of the memory cell, the first verification voltage (VER_1) and the second verification voltage (VER_2), the program state of the memory cell may be classified as a first state (ST_1), a second state (ST_2), or a third state (ST_3).

If the threshold voltage of the memory cell is less than the second verification voltage (VER_2), the memory device 110 may determine that the program state of the corresponding memory cell is the first state (ST_1). The memory device 110 may input a program pulse corresponding to a first pulse (e.g., 15V) to the corresponding memory cell in order to complete the program operation on the memory cell being in the first state (ST_1).

If the threshold voltage of the memory cell is greater than or equal to the second verification voltage (VER_2) and is less than the first verification voltage (VER_1), the memory device 110 may determine that the program state of the corresponding memory cell is the second state (ST_2). The memory device 110 may input a program pulse corresponding to a second pulse (e.g., 12V) to the corresponding memory cell in order to program data in the memory cell in the second state (ST_2). In this instance, the amplitude of second pulse is less than the amplitude of first pulse.

If the threshold voltage of the memory cell is greater than or equal to the first verification voltage (VER_1), the memory device 110 may determine that the program state of the corresponding memory cell is the third state (ST_3). The memory device 110 may not input an additional program pulse to the memory cell in the third state (ST_3).

The memory device 110 may set the result value of the first verification operation and the result value of the second verification operation using a first value (set value) and a second value (reset value), respectively. In addition, the setting of the result values of the first and second verification operations can be done in consideration of the program state of the memory cell. Hereinafter, embodiments of the disclosed technology will be described with reference to an example in which the first value is 1 and the second value is 0.

For example, in the case of the first state (ST_1), the memory device 110 may set the result value of the first verification operation to 1, and may set the result value of the second verification operation to 0. In the case of the second state (ST_2), the memory device 110 may set the result value of the first verification operation to 1, and may set the result value of the second verification operation to 1. In the case of the third state (ST_3), the memory device 110 may set the result value of the first verification operation to 0, and may set the result value of the second verification operation to 1. Hereinafter, according to various embodiments, a description will be provided with reference to the case in which the result value of a first verification operation and the result value of a second verification operation are set as described above.

If the program operation is not suspended, the memory device 110 may store the result value of the first verification operation in one of a first data latch (DL_1) and a second data latch (DL_2), and may store the result value of the second verification operation in the remaining data latch. Thus, the memory device 110 may determine the program state of the memory cell based on the result value of the first verification operation stored in the first data latch (DL_1) and the result value of the second verification operation stored in the second data latch (DL_2).

Before the program operation that was suspended is resumed, the value stored in the first data latch (DL_1) or the second data latch (DL_2) may be changed by another operation (e.g., a read operation). The reason for this is that the first data latch (DL_1) or the second data latch (DL_2) may be used when data in the memory cell is read in the state in which the program operation is suspended. In this instance, the value stored in the first data latch (DL_1) or the second data latch (DL_2) may be lost before the program operation is suspended.

Therefore, the memory device 110 may not be capable of determining the program state that the memory cell had before the program operation was suspended based on the value stored in the first data latch (DL_1) and the value stored in the second data latch (DL_2). Therefore, in the process of resuming the program operation that was suspended, the memory device 110 may need to generate the result value of the first verification operation and the result value of the second verification operation in order to accurately determine the program state of the memory cell.

Hereinafter, detailed embodiments will be described in association with an operation in which the memory device 110 produces the result value of a first verification operation and the result value of a second verification operation when resuming a program operation that was suspended.

FIG. 7 is a diagram illustrating a value stored in a first data latch (DL_1) when a program operation is suspended.

When a program operation is suspended, the memory device 110 may store a temporary value in the first data latch (DL_1), which is obtained by performing the AND operation on the result value of a first verification operation and the result value of a second verification operation. In this instance, the value obtained by performing the AND operation on the two result values is a first value when the two result values are the first value; otherwise, the value obtained by performing the AND operation is a second value.

Referring to FIG. 7, when a memory cell on which programming is performed is in a first state (ST_1), the memory device 110 may store 0 (=1 AND 0), which is a value obtained by performing the AND operation on 1, which is the result value of the first verification operation, and 0, which is the result value of the second verification operation, in the first data latch (DL_1).

If the memory cell on which programming is performed is in a second state (ST_2), the memory device 110 may store, in the first data latch (DL_1), 1 that corresponds to an output of the AND operation on 1 (which is the result value of the first verification operation) and 1 (which is the result value of the second verification operation).

If the memory cell on which programming is performed is in a third state (ST_3), the memory device 110 may store, in the first data latch (DL_1), 0 that corresponds to an output of the AND operation on 0 (which is the result value of the first verification operation) and 1 (which is the result value of the second verification operation).

FIG. 8 is a diagram illustrating the state of a first data latch and the state of a second data latch when a read operation is executed after a program operation is suspended.

Referring to FIG. 8, when the read operation is executed after the program operation is suspended, the memory device 110 may use the second data latch (DL_2) for the read operation.

In this instance, the first data latch (DL_1) stores a temporary value obtained by performing the AND operation on the result value of a first verification operation and the result value of a second verification operation, and thus the memory device 110 may not use the first data latch (DL_1) for the read operation. Therefore, information associated with the result value of the first verification operation and the result value of the second verification operation, obtained before the program operation is suspended, may be maintained in the first data latch (DL_1).

Figure 9:
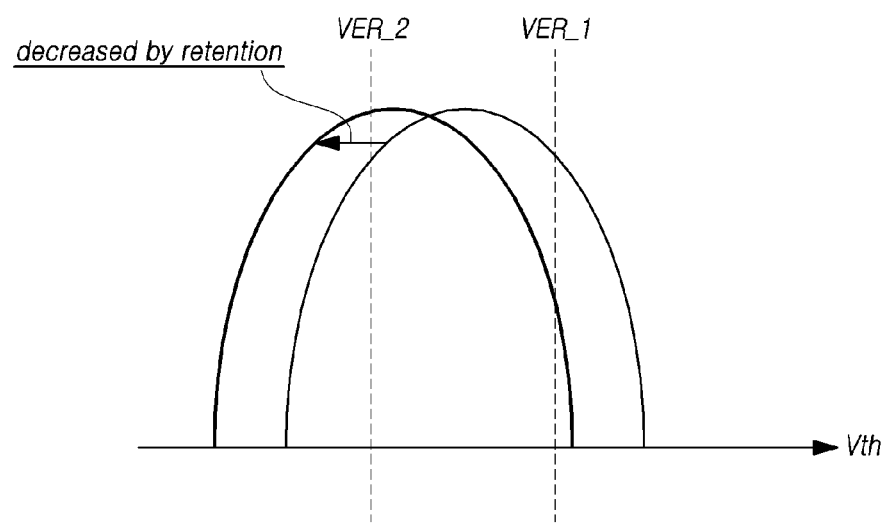
FIG. 9 is a diagram illustrating an example of a change in a threshold voltage distribution of a memory cell on which programming is performed when a program operation is suspended.

FIG. 9 is a diagram illustrating an example of a change in the threshold voltage distribution of a memory cell on which programming is performed when a program operation is suspended.

Referring to FIG. 9, the threshold voltage distribution of a memory cell on which programming is performed may be changed in the process of resuming a program operation that was suspended. For example, a memory cell of which the threshold value is decreased may be present due to the retention effect when the program operation is suspended.

In this instance, a memory cell, of which the threshold voltage was greater than or equal to a second verification voltage (VER_2) before the program operation was suspended, may have a threshold voltage less than the second verification voltage (VER_2) after the program operation is suspended. Under this situation, if a program pulse is provided to the memory cell without taking into consideration the program state obtained before the program operation was suspended, the program operation may not be performed properly and abnormal result can be obtained.

Therefore, the memory device 110 needs to identify the program state that the memory cell had before the program operation was suspended in order to enable the program operation on the memory cell to be executed properly.

In some implementations, the memory device 110 may configure to identify the program state in which the memory cell was before the program operation was suspended based on the temporary value stored in a first data latch (DL_1) and the result value of a third verification operation. The third verification operation may be performed after the program operation is resumed. Hereinafter, this will be described in detail.

Figure 10:
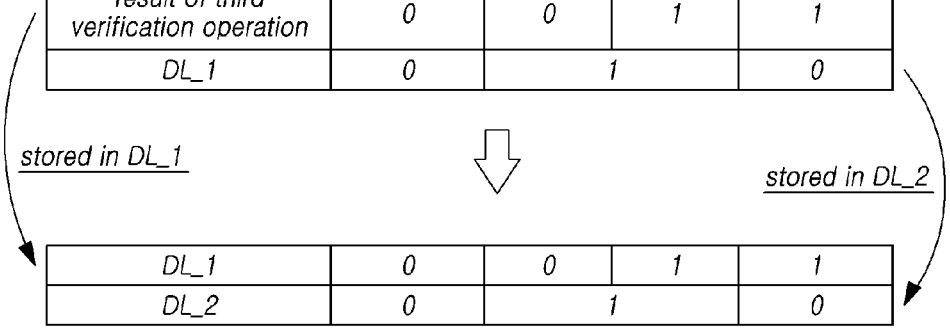
FIG. 10 is a diagram illustrating a result of a third verification operation when a program operation is resumed.

FIG. 10 is a diagram illustrating the result of a third verification operation when a program operation is resumed.

As described in FIG. 5, the memory device 110 may execute a third verification operation when a program operation that was suspended is resumed.

If the program state of a memory cell before the program operation is suspended is a first state (ST_1), the result of a first verification operation performed on the memory cell is 1 and the result of a second verification operation is 0.

In this instance, the program state of the memory cell after the program operation is resumed is also the first state (ST_1). The reason for this is that the threshold value of the memory cell, which was less than a second verification voltage (VER_2), is still less than the second verification voltage (VER_2) even though the threshold voltage is decreased due to the retention effect. Therefore, the result of a third verification operation is also 0.

If the program state of the memory cell before the program operation is suspended is a second state (ST_2), the result of the first verification operation performed on the memory cell is 1 and the result of the second verification operation is 1.

In this instance, the program state of the corresponding memory cell after the program operation is resumed may be one of a 2-1$^{th}$ state (ST_2-1) and a 2-2$^{th}$ state (ST_2-2), which are different from each other. The 2-1$^{th}$ state (ST_2-1) is a state in which the threshold value of the corresponding memory cell is decreased below the second verification voltage (VER_2) after the program operation is resumed, and the 2-2$^{th}$ state (ST_2-2) is a state in which the threshold voltage of the corresponding memory cell is greater than or equal to the second verification voltage (VER_2) after the program operation is resumed.

In the 2-1$^{th}$ state (ST_2-1), the threshold value of the memory cell is less than the second verification voltage (VER_2), and thus the result of the third verification operation is 0. In the 2-2$^{th}$ state (ST_2-2), the threshold value of the memory cell is greater than or equal to the second verification voltage (VER_2), and thus the result of the third verification operation is 1.

If the program state of the memory cell before the program operation is suspended is a third state (ST_3), the result of the first verification operation performed on the memory cell is 0 and the result of the second verification operation is 1.

In this instance, the threshold value of the memory cell after the program operation is resumed is greater than the verification voltage used in the third verification operation. Therefore, the result of the third verification operation is also 1.

As discussed above, when the program operation is suspended, the first data latch (DL_1) stores the temporary value, which is obtained by performing the AND operation on the result values of the first and second verification operations. A temporary value stored in a first data latch (DL_1) is 0 when the memory cell is in the first state (ST_1), the temporary value is 1 when the memory cell is in the second state (ST_2), and the temporary value is 0 when the memory cell is in the third state (ST_3).

After the resumption of the program operation, the memory device 110 may store the temporary value, which was stored in the first data latch (DL_1), in a second data latch (DL_2), and may store the result value of the third verification operation in the first data latch (DL_1).

Hereinafter, a detailed embodiment will be described in association with an operation of producing the result of a first verification operation and the result of a second verification operation to be identical to result values obtained before the program operation was suspended, based on a temporary value stored in a second data latch (DL_2) and the result value of a third verification operation stored in a first data latch (DL_1). A description will be provided with reference to the case in which a first value is 1 and a second value is 0.

Figure 11:
FIG. 11 is a diagram illustrating an example of a value stored in a first data latch when a program operation is resumed.

FIG. 11 is a diagram illustrating an example of a value stored in a first data latch (DL_1) when a program operation is resumed.

When producing or restoring the result of a first verification operation and the result of a second verification operation to be identical to results obtained before the program operation was suspended, if a temporary value stored in a second data latch (DL_2) is a first value, the memory device 110 may set the first data latch (DL_1) to the first value.

Referring to FIG. 11, if the state of a memory cell before the program operation is suspended is a second state (ST_2), the temporary value stored in the second data latch (DL_2) when the program operation is resumed may be 1.

Therefore, if the state of the memory cell before the program operation is suspended is a second state (ST_2), the value of the first data latch (DL_1) when the program operation is resumed is set to 1. This is irrespective of whether the state of the corresponding memory cell after the program operation is resumed is a 2-1$^{th}$ state (ST_2-1) or a 2-2$^{th}$ state (ST_2-2).

Figure 12:
FIG. 12 is a diagram illustrating an example of a value stored in a second data latch when a program operation is resumed.

FIG. 12 is a diagram illustrating an example of a value stored in a second data latch (DL_2) when a program operation is resumed.

In the process of producing or restoring the result of a first verification operation and the result of a second verification operation to be identical to results obtained before the program operation was suspended, if a temporary value stored in a second data latch (DL_2) is a second value and the result value of a third verification operation stored in a first data latch (DL_1) is the second value, the memory device 110 may set the second data latch (DL_2) to a first value.

Referring to FIG. 12, when the state of the memory cell before the program operation is suspended is a first state (ST_1), the result value of the third verification operation stored in the first data latch (DL_1) is 0 and the temporary value stored in the second data latch is 0, and thus, the second data latch (DL_2) after the program operation is resumed is set to 1.

Therefore, the value of the first data latch (DL_1) after the program operation is resumed is 0 if the state of the memory cell before the program operation is suspended is the first state (ST_1). The value of the first data latch (DL_1) after the program operation is resumed is 1 if the state of the memory cell before the program operation is suspended is the second state (ST_2). The value of the first data latch (DL_1) after the program operation is resumed is 1 if the state of the memory cell before the program operation is suspended is the third state (ST_3). Therefore, the value of the first data latch (DL_1) after the program operation is resumed is the same as the result of the second verification operation, obtained before the program operation is suspended.

The value of the second data latch (DL_2) after the program operation is resumed is 1 if the state of the memory cell before the program operation is suspended is the first state (ST_1). The value of the second data latch (DL_2) after the program operation is resumed is 1 if the state of the memory cell before the program operation is suspended is the second state (ST_2). The value of the second data latch (DL_2) after the program operation is resumed is 0 if the state of the memory cell before the program operation is suspended is the third state (ST_3). Therefore, the value of the second data latch (DL_2) after the program operation is resumed is the same as the result of the first verification operation, which was obtained before the program operation was suspended.

Therefore, the memory device 110 may produce or restore a result value of the second verification operation that is identical to a result value that was obtained before the program operation was suspended using the value of the first data latch (DL_1), and may produce or restore a result value of the first verification operation identical to a result value obtained before the program operation was suspended using the second data latch (DL_2).

Figure 13:
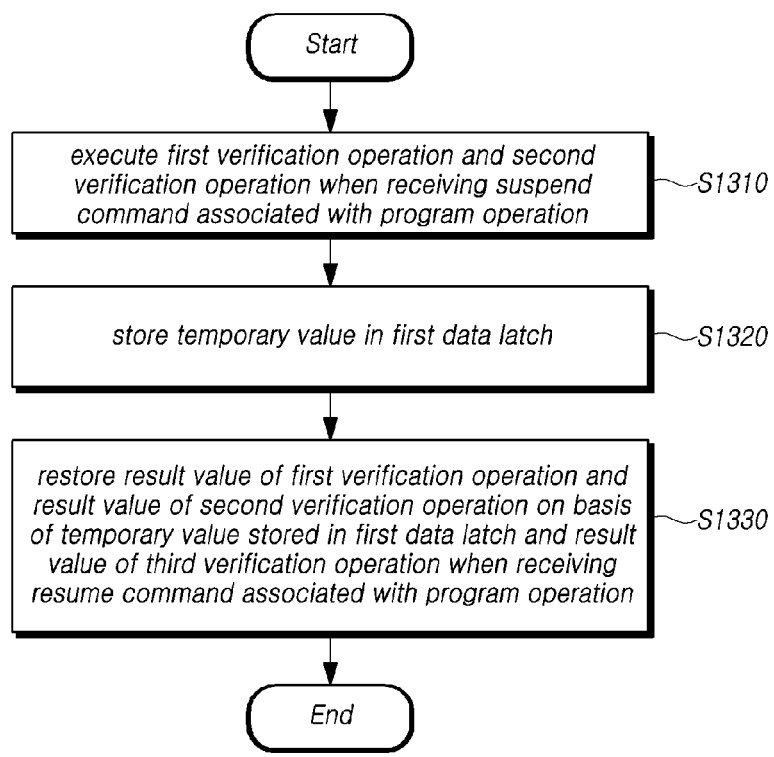
FIG. 13 is a flowchart illustrating a method of operating a memory device based on some implementations of the disclosed technology.

FIG. 13 is a flowchart illustrating a method of operating the memory device 110 according to embodiments of the disclosed technology.

The method of operating the memory device 110 may include an operation of executing a first verification operation and a second verification operation on a memory cell when a suspend command associated with a program operation is received from the memory controller 120 while the program operation on the memory cell is performed in operation S1310.

The method of operating the memory device 110 may include an operation of storing, in a first data latch (DL_1), a temporary value produced on the basis of the result values of the first verification operation and the second verification operation, which are performed in operation S1310, in operation S1320.

The method of operating the memory device 110 may include an operation of performing a third verification operation and identically restoring the result value of the first verification operation and the result value of the second verification operation on the basis of the result value of the third verification operation and the temporary value stored in the first data latch (DL_1) when receiving a resume command associated with the suspend program operation in operation S1330.

In this instance, the verification voltage used for the first verification operation may be higher than the verification voltage used for the second verification operation and the third verification operation. The verification voltage used for the second verification operation and the verification voltage used for the third verification operation may be identical.

The above-mentioned temporary value may be a first value when both the result value of the first verification operation and the result value of the second verification operation are the first value, and the temporary value may be a second value when the result value of the first verification operation or the result value of the second verification operation is the second value.

In operation S1330, when the resume command associated with the program operation is received, the temporary value, which was stored in the first data latch (DL_1), is stored in the second data latch (DL_2), and the result value of the third verification operation may be stored in the first data latch (DL_1).

In operation S1330, if the temporary value stored in the second data latch (DL_2) is the first value, the first data latch is set to the first value, and if both the temporary value stored in the second data latch (DL_2) and the result value of the third verification operation stored in the first data latch (DL_1) are the second value, the second data latch (DL_2) is set to the first value.

Figure 14:
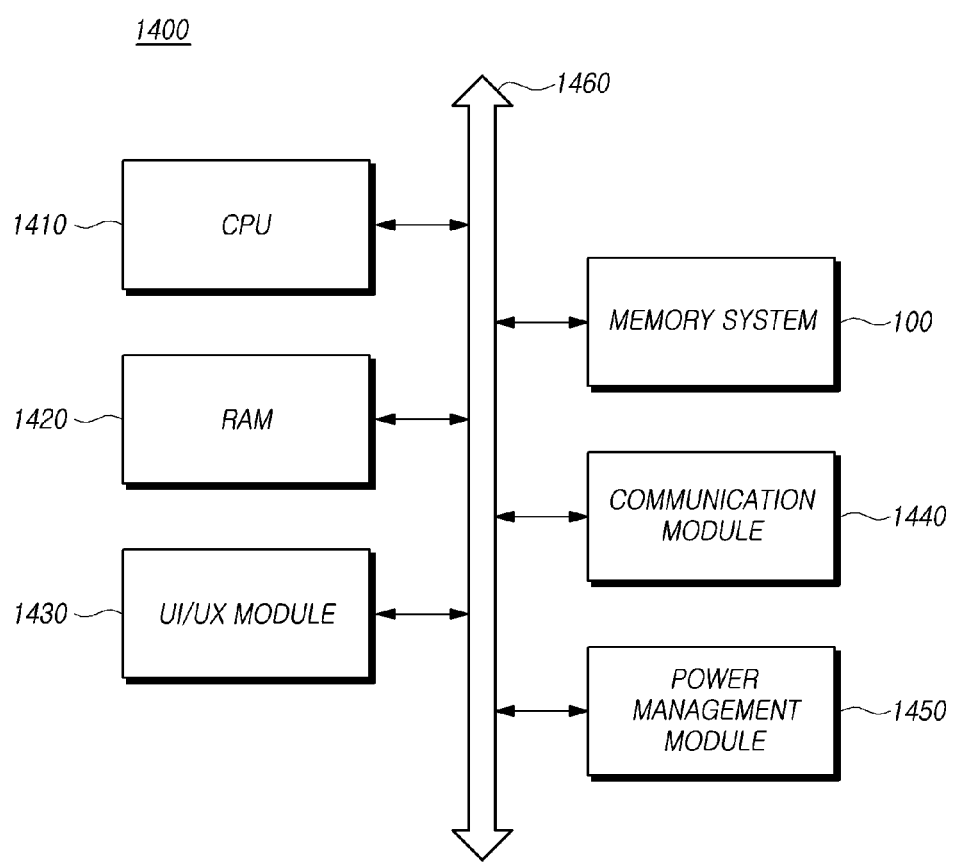
FIG. 14 is a diagram illustrating a configuration of a computing system based on some implementations of the disclosed technology.

FIG. 14 is a diagram illustrating the configuration of a computing system 1400 according to an embodiment of the disclosed technology.

Referring to FIG. 14, the computing system 1400 according to an embodiment of the disclosed technology may include: a memory system 100 electrically connected to a system bus 1460; a CPU 1410 configured to control the overall operation of the computing system 1400; a RAM 1420 configured to store data and information related to operations of the computing system 1400; a user interface/user experience (UI/UX) module 1430 configured to provide the user with a user environment; a communication module 1440 configured to communicate with an external device as a wired and/or wireless type; and a power management module 1450 configured to manage power used by the computing system 1400.

The computing system 1400 may be a personal computer (PC) or may include a mobile terminal such as a smartphone, a tablet or various electronic devices.

The computing system 1400 may further include a battery for supplying an operating voltage, and may further include an application chipset, a graphic-related module, a camera image processor, and a DRAM. Other elements would be obvious to a person skilled in the art.

The memory system 100 may include not only a device configured to store data in a magnetic disk such as a hard disk drive (HDD), but also a device configured to store data in a nonvolatile memory such as a solid state drive (SSD), a universal flash storage device, or an embedded MMC (eMMC) device. The non-volatile memory may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. In addition, the memory system 100 may be implemented as storage devices of various types and mounted inside various electronic devices.

According to embodiments of the disclosed technology described above, the operation delay time of the memory system may be minimized. In addition, according to an embodiment of the disclosed technology, an overhead occurring in the process of calling a specific function may be minimized. Although various embodiments of the disclosed technology have been described for illustrative purposes, those skilled in the art will appreciate that various modifications, additions and substitutions are possible based on the disclosure of this document.

What is claimed is:

1. A memory system comprising:
   a memory device including a memory cell array including a memory cell programmable in multiple states; and
   a memory controller in communication with the memory device and configured to control the memory device,
   wherein the memory device further includes a first data latch storing information about a state of the memory cell and is configured to:
   execute a first verification operation and a second verification operation on the memory cell in response to receiving, from the memory controller, a suspend command to suspend a program operation being performed on the memory cell, wherein the first verification operation and the second verification operation are performed using verification voltages to determine a state of the memory cell;
   store, in the first data latch, a temporary value obtained based on a result value of the first verification operation and a result value of the second verification operation; and
   execute, in response to receiving, from the memory controller, a resumption command to resume the program operation, a third verification operation, and restore the result value of the first verification operation and the result value of the second verification operation based on a result value of the third verification operation and the temporary value stored in the first data latch.

2. The memory system of claim 1, wherein a verification voltage used for the first verification operation is higher than a verification voltage used for the second verification operation and the third verification operation.

3. The memory system of claim 2, wherein the verification voltage used for the second verification operation and the verification voltage used for the third verification operation are identical.

4. The memory system of claim 1, wherein the memory device is configured to: set the temporary value to a first value when both of the result value of the first verification operation and the result value of the second verification operation are the first value; and set the temporary value to a second value when the result value of the first verification operation or the result value of the second verification operation is the second value.

5. The memory system of claim 4, wherein the memory device further comprises a second data latch configured to be used during a read operation that is executed between the receiving of the suspension command and the receiving of the resumption command.

6. The memory system of claim 5, wherein the memory device is further configured to, in response to the receiving of the resumption command, store the temporary value that has been stored in the first data latch in the second data latch; and store the result value of the third verification operation in the first data latch.

7. The memory system of claim 6, wherein the memory device is further configured to:
   set the first data latch to the first value when the temporary value stored in the second data latch is the first value; and
   set the second data latch to the first value when both of the temporary value stored in the second data latch and the result value of the third verification operation stored in the first data latch are the second value.

8. A memory device that communicates with a memory controller, the memory device comprising:
   a memory cell programmable in multiple states;
   a first data latch storing information about a state of the memory cell, and
   wherein the memory device is further configured to:
   execute a first verification operation and a second verification operation on the memory cell in response to receiving, from the memory controller, a suspend command to suspend a program operation being performed on the memory cell, wherein the first verification operation and the second verification operation are performed different verification voltages to verify a state of the memory cell;
   store, in the first data latch, a temporary value obtained based on a result value of the first verification operation and a result value of the second verification operation; and
   execute a third verification operation in response to receiving, from the memory controller, a resumption command to resume the program operation, and restore the result value of the first verification operation and the result value of the second verification operation based on a result value of the third verification operation and the temporary value stored in the first data latch.

9. The memory device of claim 8, wherein a verification voltage used for the first verification operation is higher than a verification voltage used for the second verification operation and the third verification operation.

10. The memory device of claim 9, wherein the verification voltage used for the second verification operation and the verification voltage used for the third verification operation are identical.

11. The memory device of claim 8, wherein the temporary value is set to a first value when both of the result value of the first verification operation and the result value of the second verification operation are the first value, and the temporary value is set to a second value when the result value of the first verification operation or the result value of the second verification operation is the second value.

12. The memory device of claim 11, further comprising:
   a second data latch configured to be used during a read operation that is executed between the receiving of the suspension command and the receiving of the resumption command.

13. The memory device of claim 12, wherein the memory device is further configured to, in response to the receiving of the resumption command, store the temporary value that has been stored in the first data latch, in the second data latch, and to store the result value of the third verification operation in the first data latch.

14. The memory device of claim 13, wherein the memory device is further configured to, in response to the receiving of the resumption command: set the first data latch to the first value when the temporary value stored in the second data latch is the first value; and set the second data latch to the first value when both the temporary value stored in the second data latch and the result value of the third verification operation stored in the first data latch are the second value.

15. A method of operating a memory device that communicates with a memory controller, the method comprising:

receiving, from the memory controller, a suspend command to suspend a program operation being performed on a memory cell included in the memory device and programmable in multiple states;

executing a first verification operation and a second verification operation on the memory cell using verification voltages to determine a state of the memory cell;

storing, in a first data latch of the memory device, a temporary value obtained based on a result value of the first verification operation and a result value of the second verification operation; receiving, from the memory controller, a resumption command to resume the program operation; and executing a third verification operation and restoring the result value of the first verification operation and the result value of the second verification operation based on a result value of the third verification operation and the temporary value stored in the first data latch.

16. The method of claim 15, wherein the temporary value is a first value when both of the result value of the first verification operation and the result value of the second verification operation are the first value, and the temporary value is a second value when the result value of the first verification operation or the result value of the second verification operation is the second value.

17. The method of claim 16, wherein the restoring of the result value of the first verification operation and the result value of the second verification operation includes storing the temporary value that has been stored in the first data latch in a second data latch, and storing the result value of the third verification operation in the first data latch.

18. The method of claim 17, wherein the restoring of the result value of the first verification operation and the result value of the second verification operation includes setting the first data latch to the first value when the temporary value stored in the second data latch is the first value, and setting the second data latch to the first value when both of the temporary value stored in the second data latch and the result value of the third verification operation stored in the first data latch are the second value.

* * * * *